United States Patent
Liu

(10) Patent No.: US 8,355,273 B2
(45) Date of Patent: Jan. 15, 2013

(54) VARIABLE-RESISTANCE MATERIAL MEMORIES, PROCESSES OF FORMING SAME, AND METHODS OF USING SAME

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 12/986,717

(22) Filed: Jan. 7, 2011

(65) Prior Publication Data

US 2011/0103129 A1 May 5, 2011

Related U.S. Application Data

(62) Division of application No. 11/857,647, filed on Sep. 19, 2007, now Pat. No. 7,876,597.

(51) Int. Cl.
 *G11C 11/00* (2006.01)
(52) U.S. Cl. ........................ 365/148; 365/163
(58) Field of Classification Search .............. 365/148, 365/46, 100, 163, 158, 171
 See application file for complete search history.

(56) References Cited

U.S. PATENT DOCUMENTS

| | | |
|---|---|---|
| 5,923,587 A | 7/1999 | Choi |
| 6,961,258 B2 | 11/2005 | Lowrey |
| 6,992,365 B2 | 1/2006 | Xu et al. |
| 7,002,837 B2 | 2/2006 | Morimoto |
| 7,583,528 B2 | 9/2009 | Aoki |
| 7,876,597 B2 | 1/2011 | Liu |
| 2002/0097598 A1 | 7/2002 | Hoenigschmid |
| 2004/0125646 A1 | 7/2004 | Durlam et al. |
| 2004/0174732 A1 | 9/2004 | Morimoto |
| 2005/0248978 A1 | 11/2005 | Chen et al. |
| 2005/0266634 A1 | 12/2005 | Park et al. |
| 2006/0110877 A1 | 5/2006 | Park et al. |
| 2006/0145240 A1 | 7/2006 | Park et al. |
| 2006/0231887 A1 | 10/2006 | Kim et al. |
| 2006/0284237 A1 | 12/2006 | Park et al. |
| 2007/0121369 A1 | 5/2007 | Happ |
| 2008/0185571 A1 | 8/2008 | Happ et al. |
| 2009/0052230 A1 | 2/2009 | Rajendran et al. |
| 2009/0072341 A1 | 3/2009 | Liu et al. |
| 2009/0073741 A1 | 3/2009 | Liu |

FOREIGN PATENT DOCUMENTS

| | | |
|---|---|---|
| EP | 1696441 A1 | 8/2006 |
| JP | 00236078 A2 | 8/2000 |
| WO | WO-2009038747 A2 | 3/2009 |
| WO | WO-2009038780 A2 | 3/2009 |

(Continued)

OTHER PUBLICATIONS

Beckett, Paul, "Towards a Reconfigurable Nanocomputer Platform", Proc. of the 7th Asia-Pacific Computer Systems Architectures Conference(ACSAC). Melbourne, Australia: ACS, (Jan. 2002), 1-8.

(Continued)

*Primary Examiner* — Douglas King
(74) *Attorney, Agent, or Firm* — Schwegman, Lundberg & Woessner, P.A.

(57) ABSTRACT

A variable-resistance material memory array includes a series of variable-resistance material memory cells. The series of variable-resistance material memory cells can be arranged in parallel with a corresponding series of control gates. A select gate can also be disposed in series with the variable-resistance material memory cells. Writing/reading/erasing to a given variable-resistance material memory cell can include turning off the corresponding control gate, while turning on all other control gates. Various devices can include such a variable-resistance material memory array.

21 Claims, 10 Drawing Sheets

FOREIGN PATENT DOCUMENTS

| WO | WO-2009038780 A3 | 3/2009 |
| WO | WO-2009038747 A3 | 6/2009 |

OTHER PUBLICATIONS

Cho, Woo Yeong, et al., "A 0.18-um 3.0- V 64-Mb Nonvolatile Phase-Transition Random Access Memory (PRAM)", IEEE Journal of Solid-State Circuits, 40(1), (Jan. 2005), 293-300.

Hwang, Y. N., "Phase-change chalcogenide nonvolatile RAM completely based on CMOS technology", IEEE 2003 International Symposium on VLSI Technology, Systems, and Applications, (2003), 29-31.

Matsuzaki, N., et al., "Oxygen-doped gesbte phase-change memory cells featuring 1.5 V/100-/spl mu/A standard 0.13/spl mu/m CMOS operations", IEEE International Electron Devices Meeting, 2005. IEDM Technical Digest., (2005), 738-741.

Oh, J. H., et al., "Full Integration of Highly Manufacturable 512Mb PRAM based on 90nm Technology", IEEE International Electron Devices Meeting, 2006. IEDM '06., (2006), 1-4.

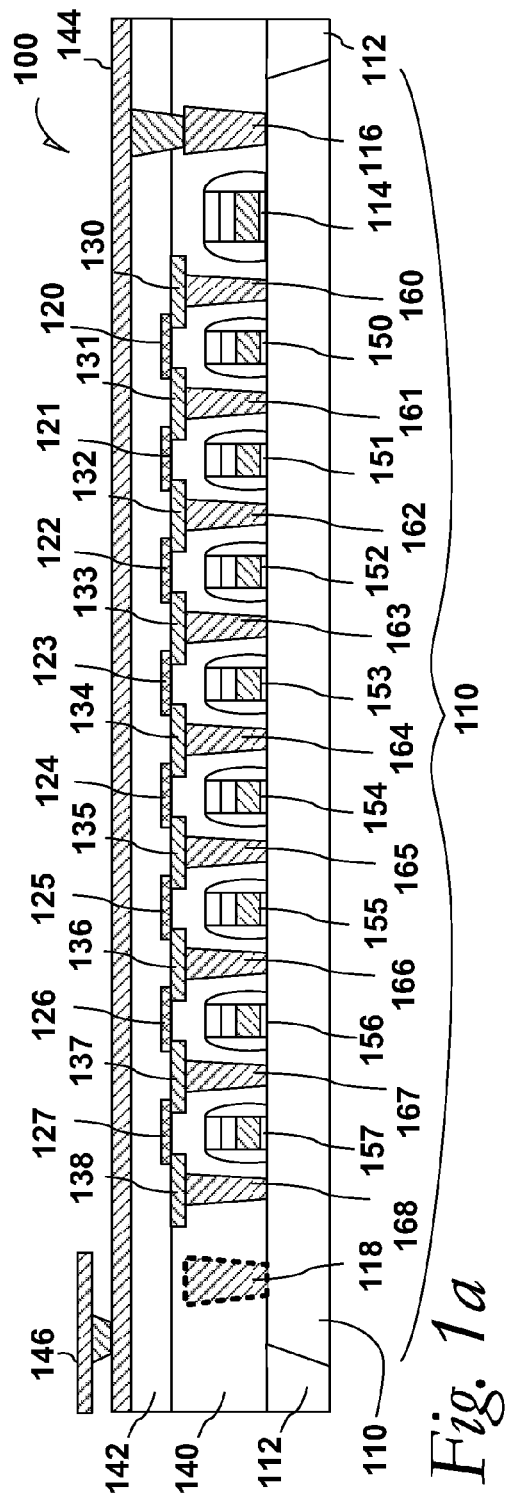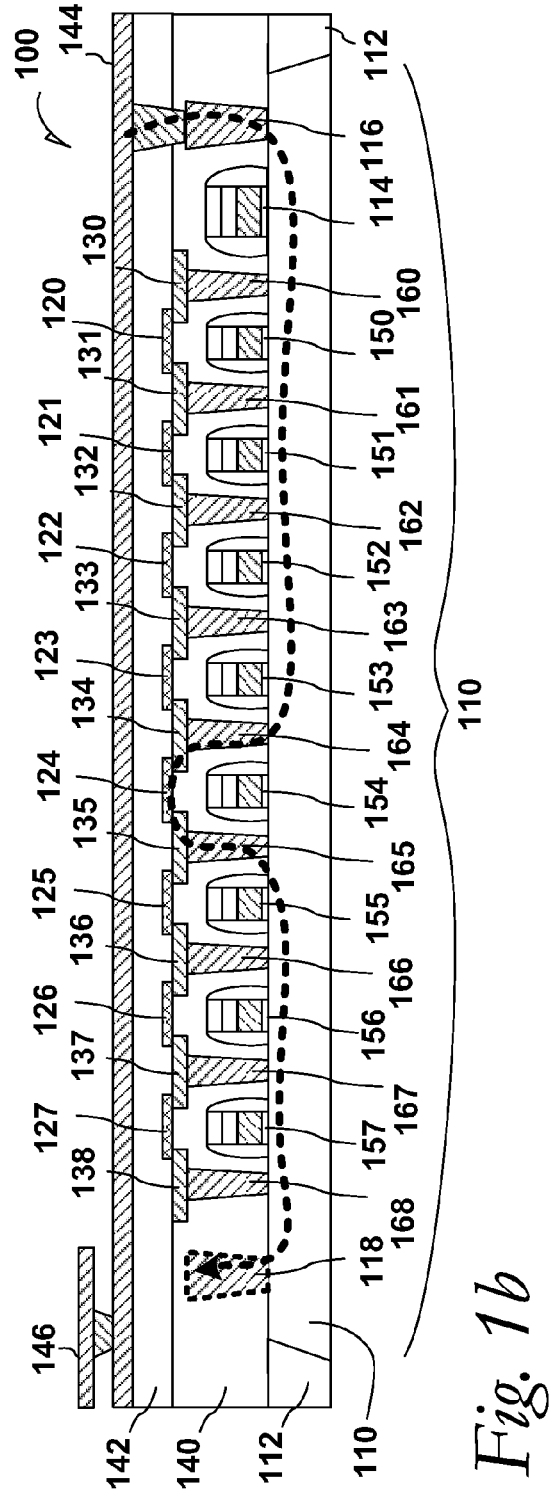

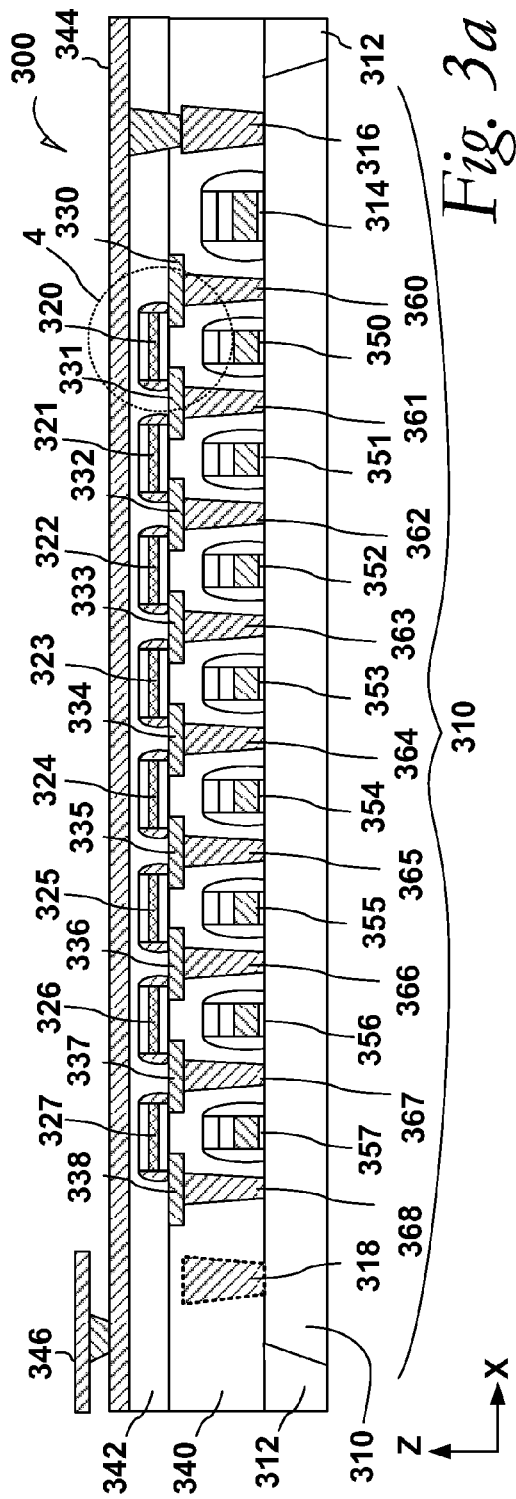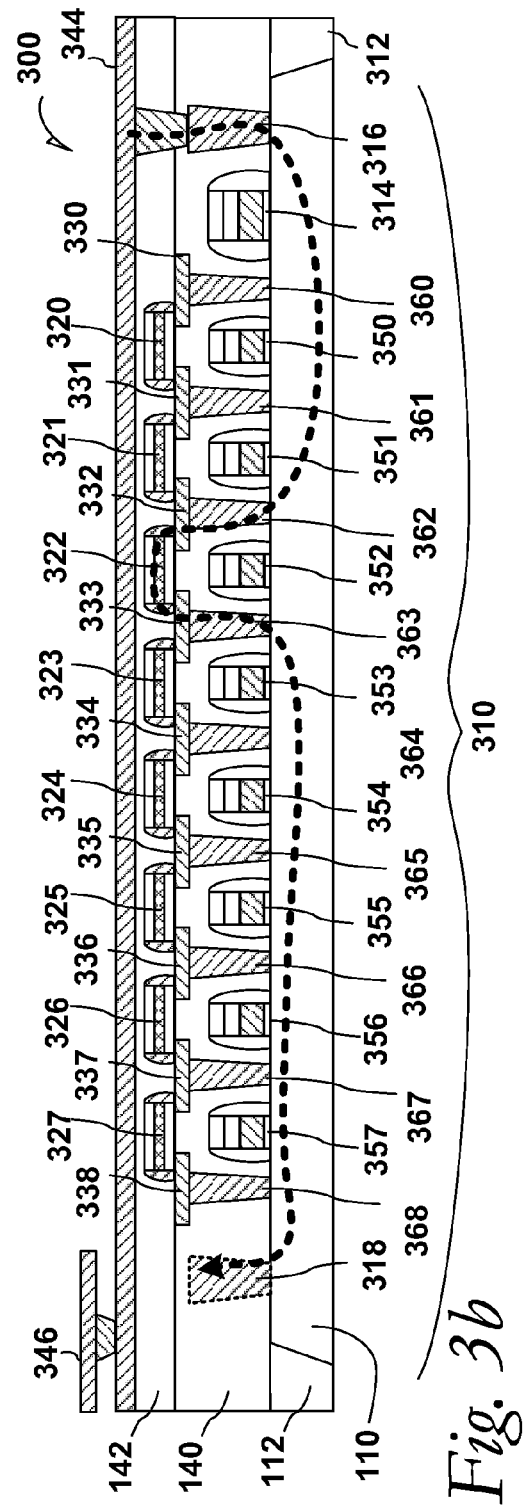

VARIABLE-RESISTANCE MATERIAL MEMORIES, PROCESSES OF FORMING SAME, AND METHODS OF USING SAME

PRIORITY APPLICATION

This application is a divisional of U.S. application Ser. No. 11/857,647, filed Sep. 19, 2007, now U.S. Pat. No. 7,876,597 which is incorporated herein by reference in its entirety.

TECHNICAL FIELD

This disclosure relates generally to variable-resistance material random-access memories.

BACKGROUND

Variable-resistance material memory structures often rely upon isolation of individual memory cells. The memory cells may be connected to a bit line in a parallel manner, and four metal layers, including the word line, bit line, top-electrode selection line, and the global data bus are used to program and read the data. The isolation of the individual memory cells creates tension for the designer to continue to miniaturize circuitry.

What are needed are methods to form better structures that can address these challenges. What are also needed are improved variable-resistance material random-access memory structures that can also address these challenges.

BRIEF DESCRIPTION OF THE DRAWINGS

Several embodiments are addressed by the present disclosure and will be understood by reading and studying the following specification, of which the figures are a part.

FIG. 1a shows a cross-section elevation of a semiconductor device 100 according to an embodiment;

FIG. 1b is a cross-section elevation of the semiconductor device depicted in FIG. 1a according to a method embodiment;

FIG. 3a shows a cross-section elevation of a semiconductor device 100 according to an embodiment;

FIG. 3b is a cross-section elevation of the semiconductor device depicted in FIG. 3a according to a method embodiment;

DETAILED DESCRIPTION

Figure 2:
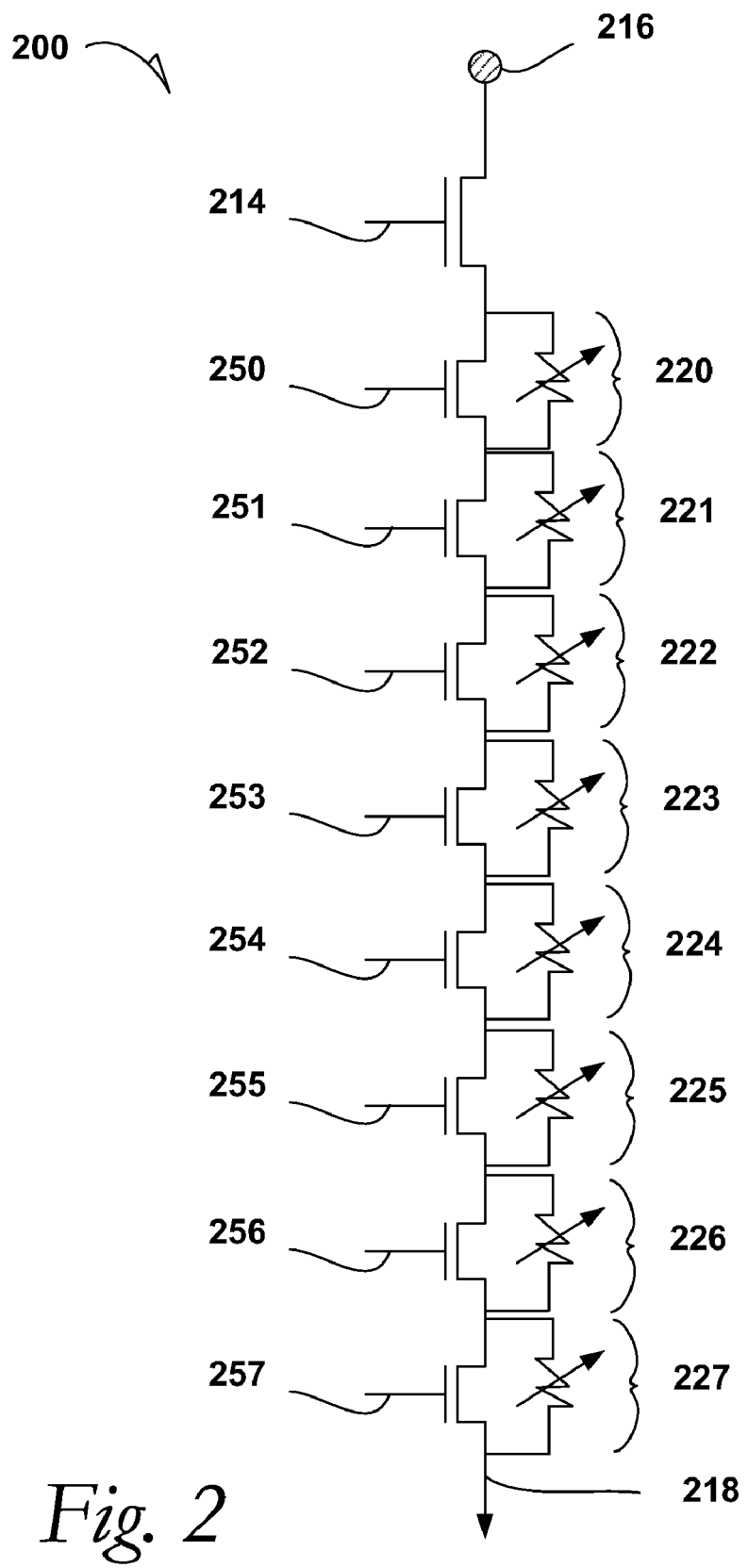
FIG. 2 is a circuitry schematic of a NAND logic circuit according to an embodiment.

The embodiments of a device, an apparatus, or an article described herein can be manufactured, used, or shipped in a number of positions and orientations. A variable-resistance material memory (VRMM) device may include a material such as an alloy. A VRMM device may include a material such as a quasi-metal composition. A VRMM device may include a material such as metal oxides. A VRMM device may include a material such as chalcogenides. These several materials can be very diverse in quality and performance.

FIG. 1a shows a cross-section elevation of a semiconductor device 100 according to an embodiment. The semiconductor device 100 may be used as a not-and (NAND) logic circuit for a memory device.

A semiconductive substrate 110 has been formed. Laterally encompassing the semiconductive substrate 110 are first and second shallow-trench isolation (STI) structures 112. The first STI 112 and the second STI 112 are used to laterally isolate semiconductive substrate 110. A bit line 116 (also referred to as a bit line contact) and a common source 118 (also referred to as a common source contact) also laterally encompass the semiconductive substrate 110. The common source contact 118 is depicted as a trace that passes orthogonally to the plane of the illustration.

In an embodiment, a series of memory cells includes a first VRMM cell 120, a second VRMM cell 121, a third VRMM cell 122, a fourth VRMM cell 123, a fifth VRMM cell 124, a sixth VRMM cell 125, a seventh VRMM cell 126, and an eighth VRMM cell 127. Although the series of VRMM cells is depicted as an octet, other numbers ("n") of VRMM cells may be configured, such as 16, 32, 64, 128, etc. It should be observed that the number of VRMM cells may be placed in arrays that are powers of the number two, and that upper limits to array sizes are limited by current technological capabilities. The number, n, therefore is not meant to be unlimited; rather, it is meant to be limited by conventional technological capabilities as they develop in forming VRMM arrays.

A select gate 114 is provided to allow access to the array of the several VRMM cells 120, 121, 122, 123, 124, 125, 126, and 127.

In an embodiment, each of the several VRMM cells 120, 121, 122, 123, 124, 125, 126, and 127 are variable-resistance materials such as those set forth in this disclosure.

Several variable-resistance materials may be used for the several memory cells. In an embodiment, the variable-resistance material that may be used as a phase-change random-access memory (PCRAM) cell is a gallium (Ga) containing material. Selected gallium-containing materials that may be used include GaSb, Ga—Ge—Sb, Ga—Se—Te, and others. In some gallium-containing phase-change material embodiments, the gallium is present in a majority amount (greater than or equal to 50 percent). In some gallium-containing phase-change material embodiments, the gallium is present in a plurality amount (gallium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a germanium (Ge) containing material. Selected germanium-containing materials that may be used include Ge—Te, Ge—Sb—Te, Ge—Te—As, Ge—Se—Ga, Ge—In—Sb, Ge—Te—Sb—S, Ge—Te—Sn—O, Ge—Te—Sn—Au, Ge—Pd—Te—Sn, Ge—Sb—Te—Pd, Ge—Sb—Te—Co, Ge—Sb—Se—Te, Ge—Sn—Te, Ge—Te—Sn—Ni, Ge—Te—Sn—Pd, Ge—Te—Sn—Pt, and others. In some germanium-containing phase-change material embodiments, the germanium is present in a majority amount (greater than or equal to 50 percent). In some germanium-containing phase-change material embodiments, the germanium is present in a plurality amount (germanium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an indium (In) containing material. Selected indium-containing materials that may be used include In—Se, In—Sb, In—Sb—Te, In—Sb—Ge, In—Se—Ti—Co, In—Ag—Sb—Te, and others. In some indium-containing phase-change material embodiments, the indium is present in a majority amount (greater than or equal to 50 percent). In some indium-containing phase-change material embodiments, the indium is present in a plurality amount (indium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an antimony (Sb) containing material. Selected antimony-containing materials that may be used include $Sb_2Te_3$, Sb—Ga, Sb—Bi—Se, Sb—Sn—Te, Sb—In—Ge, Sb—Te—Ge—S, Sb—Ge—Te—Pd, Sb—Ge—Te—Co, Sb—Te—Bi—Se, Sb—Ag—In—Te, Sb—Ge, Sb—Ge—Se—Te, Sb—Ge—Sn—Te, and others. In some antimony-containing phase-change material embodiments, the antimony is present in a majority amount (greater than or equal to 50 percent). In some antimony-containing phase-change material embodiments, the antimony is present in a plurality amount (antimony being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a tellurium (Te) containing material. Selected tellurium-containing materials that may be used include Te—Ge, Te—Sb, Te—As, Te—Al, Te—Ge—Sb, Te—Ge—As, Te—In—Sb, Te—Sn—Se, Te—Ga—Se, Te—Sn—Sb, Te—Ge—Sb—S, Te—Ge—Sn—O, Te—Ge—Sn—Au, Te—Pd—Ge—Sn, Te—Ge—Sb—Pd, Te—Ge—Sb—Co, Te—Sb—Bi—Se, Te—Ag—In—Sb, Te—Ge-Ab—Se, Te—Ge—Sn—Sb, Te—Ge—Sn—Ni, Te—Ge—Sn—Pd, Te—Ge—Pd—Pt and others. In some tellurium-containing phase-change material embodiments, the tellurium is present in a majority amount (greater than or equal to 50 percent). In some tellurium-containing phase-change material embodiments, the tellurium is present in a plurality amount (tellurium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a selenium (Se) containing material. Selected selenium-containing materials that may be used include Se—In, Se—Te—Sn, Se—Ge—Ga, Se—Bi—Sb, Se—Ga—Te, Se—In—Ti—Co, Se—Sb—Te—Bi, Se—Ge—Sb—Te, and others. In some selenium-containing phase-change material embodiments, the selenium is present in a majority amount (greater than or equal to 50 percent). In some selenium-containing phase-change material embodiments, the selenium is present in a plurality amount (selenium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an arsenic (As) containing material. Selected arsenic-containing materials that may be used include As—Te, As—Te—Ge, and others. In some arsenic-containing phase-change material embodiments, the arsenic is present in a majority amount (greater than or equal to 50 percent). In some arsenic-containing phase-change material embodiments, the arsenic is present in a plurality amount (arsenic being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an aluminum (Al) containing material. Selected aluminum-containing materials that may be used include Al—Te, Al—Se and others. In some aluminum-containing phase-change material embodiments, the aluminum is present in a majority amount.

In an embodiment, the variable-resistance material that may be used as a PCRAM cell is a tin (Sn) containing material. Selected tin-containing materials that may be used Sn—Te—Se, Sn—Sb—Te, Sn—Te—Ge—O, Sn—Pd—Te—Ge, Sn—Ge—Sb—Te, Sn—Ge—Sb—Te, Sn—Ge—Te—Ni, Sn—Ge—Te—Pd, Sn—Ge—Te—Pt, and others. In some tin-containing phase-change material embodiments, the tin is present in a majority amount (greater than or equal to 50 percent). In some tin-containing phase-change material embodiments, the tin is present in a plurality amount (tin being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a palladium (Pd) containing material. Selected palladium-containing materials that may be used Pd—Te—Ge—Sn, Pd—Ge—Sb—Te, and others. In some palladium-containing phase-change material embodiments, the palladium is present in a majority amount (greater than or equal to 50 percent). In some palladium-containing phase-change material embodiments, the palladium is present in a plurality amount (palladium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a silver (Ag) containing material. Selected silver-containing materials that may be used Ag—In—Sb—Te, and others. In some silver-containing phase-change material embodiments, the silver is present in a majority amount (greater than or equal to 50 percent). In some silver-containing phase-change material embodiments, the silver is present in a plurality amount (silver being the most prevalent element). In some embodiments, the first-listed element is present in either a majority or plurality amount, and the subsequent-listed elements are listed by order of decreasing amounts on an elemental scale.

In an embodiment, the variable-resistance material may include one of various materials used to form so-called "colossal magnetoresistive films" such as, for example, $Pr_{(1-x)}Ca_xMnO_3$ (PCMO), $La_{(1-x)}Ca_xMnO_3$ (LCMO), and $Ba_{(1-x)}Sr_xTiO_3$.

In an embodiment, the variable-resistance material may include a binary or ternary doped or undoped oxide material such as, for example, $Al_2O_3$, $BaTiO_3$, $SrTiO_3$, $Nb_2O_5$, $SrZrO_3$, $TiO_2$, $Ta_2O_5$, NiO, $ZrO_x$, $HfO_x$, and $Cu_2O$.

In an embodiment, the variable-resistance material may have a Perovskite structure.

In an embodiment, the variable-resistance material includes a doped chalcogenide glass of the general formula $A_xB_y$, where B is selected from sulfur (S), selenium (Se), and tellurium (Te), and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) with one or more dopants selected from noble metal and transition metal elements such as, for example, Au, Ag, Pt, Cu, Cd, In, Ru, Co, Cr, Ni, Mn, and Mo.

Referring again to FIG. 1a, the semiconductor device 100 includes a series of electrodes 130, 131, 132, 133, 134, 135, 136, 137, and 138. The bit line 116 and the common source 118, along with the series of electrodes 130, 131, 132, 133, 134, 135, 136, 137, and 138 are disposed in a dielectric first film 140. The dielectric first film 140 may also be referred to as an interlayer dielectric (ILD) first film 140. A dielectric second film 142 is disposed above the dielectric first film 140, and the array of the several memory cells 120, 121, 122, 123, 124, 125, 126, and 127 is disposed in the dielectric second film 142. The dielectric second film 142 may also be referred to as an ILD second film 142.

A bit-line trace 144 is disposed above the dielectric second film 142, and a global data bus 146 is coupled to the bit-line trace 144. The common source contact 118 is depicted as a trace that passes orthogonally to the plane of the illustration. For example, where the global data bus 146 may be positioned directly above the eighth electrode 138, the common source contact 118 may be coupled through the ILD second film 142 at the same position depicted in FIG. 1a. Consequently, the global data bus 146 would be out of the way of the common source contact 118 as it penetrates the ILD second film 142.

Below each of the several VRMM cells 120, 121, 122, 123, 124, 125, 126, and 127 is a corresponding control gate 150, 151, 152, 153, 154, 155, 156, and 157. Each corresponding control gate is configured in parallel to a given VRMM cell. For example, the control gate 155 is configured in parallel to the VRMM cell 125. Each electrode has a corresponding electrode contact 160, 161, 162, 163, 164, 165, 166, 167, and 168.

FIG. 1b is a cross-section elevation of the semiconductor device 100 depicted in FIG. 1a according to a method embodiment. Potential and current, illustrated as a dashed line, are depicted as exhibiting a presence in the bit line 116, and in the semiconductive substrate 110. According to the method embodiment illustrated, a read or a write process is being carried out in the VRMM cell 124. Accordingly, the select gate 114 has allowed the potential and current from the bit line 116 to be exhibited also in the semiconductive substrate 110. To read or write to the VRMM cell 124, which is part of an 8-cell memory block according to this embodiment, the control gates 150, 151, 152, 153, 155, 156, and 157 are turned on. The control gate 154, however, is turned off. This configuration allows depletion in the semiconductive substrate 110, and current passes through the semiconductive substrate 110, but diverts through the fifth VRMM cell 124 because the fifth control gate 154 is turned off such that it does not allow current to pass through the semiconductive substrate 110 directly therebelow.

In a write operation according to an non-limiting embodiment, the fifth electrode 134 acts as a de facto bottom electrode and the sixth electrode 135 acts as a de facto top electrode 135. Accordingly, "top" electrodes are effectively eliminated compared to conventional VRMM cells. Further, because there is no "top" electrode, a metallization layer is also eliminated compared to conventional VRMM cells.

It can now be appreciated that more than one VRMM cell can be written to or erased in a block write or erase command.

FIG. 2 is a circuitry schematic of a NAND logic circuit 200 according to an embodiment. A bit line 216 is coupled to a select gate 214. The select gate 214 is coupled to a common source 218, and the bit line 216 and common source 218 encompass an array of memory cells including a first VRMM cell 220, a second VRMM cell 221, a third VRMM cell 222, a fourth VRMM cell 223, a fifth VRMM cell 224, a sixth VRMM cell 225, a seventh VRMM cell 226, and an eighth VRMM cell 227. Although the series of VRMM cells is depicted as an octet, other numbers of VRMM cells may be configured, such as 16, 32, 64, 128, etc.

Coupled to each of the several VRMM cells 220, 221, 222, 223, 224, 225, 226, and 227 is a corresponding control gate 250, 251, 252, 253, 254, 255, 256, and 257. Each corresponding control gate is configured in parallel to a given VRMM cell. For example, the control gate 255 is configured in parallel to the VRMM cell 225.

FIG. 3a shows a cross-section elevation of a semiconductor device 300 according to an embodiment. The semiconductor device 300 may be used as a NAND logic circuit for a memory device.

A semiconductive substrate 310 has been formed. Laterally encompassing the semiconductive substrate 310 are first and second STI structures 312. The first STI 312 and the second STI 312 are used to laterally isolate the semiconductive substrate 310. A bit line 316 and a common source 318 also laterally encompass the semiconductive substrate 310. The common source 318 is depicted as a trace that passes orthogonally to the plane of the illustration in FIG. 3a.

In an embodiment, a series of memory cells includes a first VRMM cell 320, a second VRMM cell 321, a third VRMM cell 322, a fourth VRMM cell 323, a fifth VRMM cell 324, a sixth VRMM cell 325, a seventh VRMM cell 326, and an eighth VRMM cell 327.

In comparison to the semiconductor device 100 depicted in FIGS. 1a and 1b, the semiconductor device 300 has structures that surround the several VRMM cells 320, 321, 322, 323, 324, 325, 326, and 327.

Figure 3C:
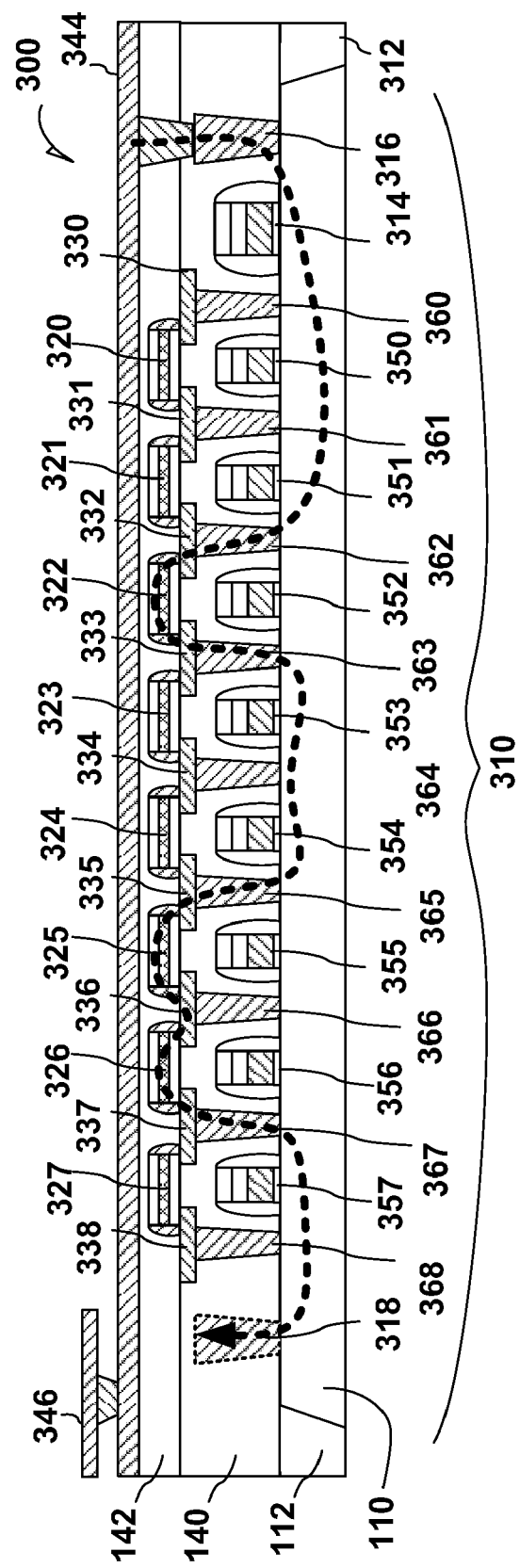
FIG. 3c is a cross-section elevation of the semiconductor device depicted in FIG. 3a according to a method embodiment.
Figure 4:
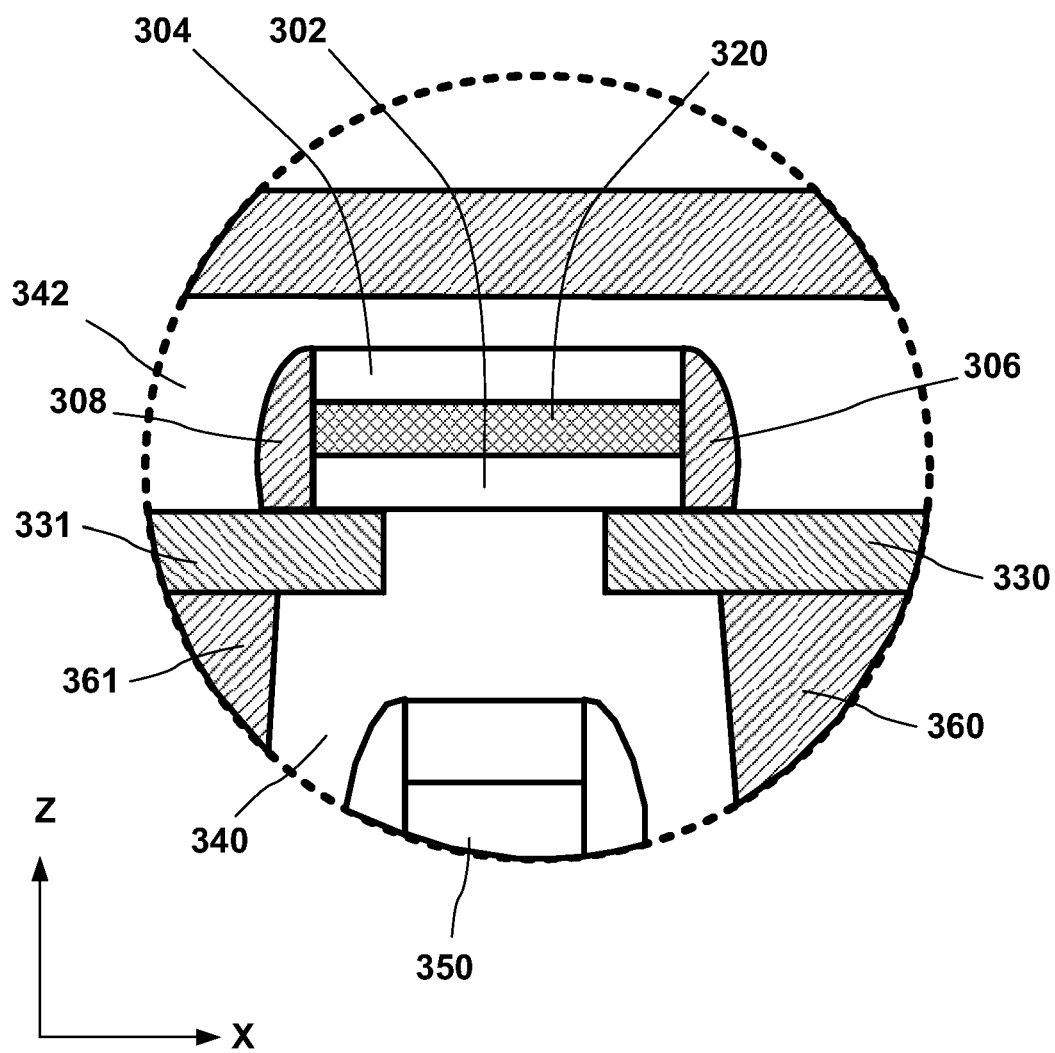
FIG. 4 is a detail section taken from FIG. 3a at 4 according to an embodiment.

FIG. 4 is a detail section taken from FIG. 3a at 4. The VRMM cell 320 is surrounded by spacer electrodes 306 and 308. In an embodiment, the spacer electrodes 306 and 308 are metal or a metal alloy. In an embodiment, the spacer electrodes 306 and 308 are doped polysilicon.

The spacer electrodes 306 and 308 are formed over a memory structure that includes the VRMM cell 320, and a lower and an upper film 302 and 304, respectively. In an embodiment, the lower film 302 is a dielectric. In an embodiment, the upper film 304 is a dielectric. In an embodiment, the material of the lower film 302 is different in quality than the material of the upper film 304. In an embodiment, the material of the lower film 302 is similar in quality to the material of the upper film 304. In an embodiment, the material of the lower film 302 is the same material as the material of the upper film 304.

To achieve the memory structure, which includes the spacer electrodes 306 and 308, the lower and upper films 302 and 304, and the VRMM cell 320, processing can be done to achieve a self-aligned VRMM cell 320 that is positioned between two pads 330 and 331 that in turn are coupled to the contacts 360 and 361.

Referring again to FIG. 3a, the semiconductor device 300 includes a select gate 314 that is provided to allow access to the array of the several VRMM memory cells 320, 321, 322, 223, 324, 325, 326, and 327.

In an embodiment, each of the several VRMM cells 320, 321, 322, 323, 324, 325, 326, and 327 are variable-resistance materials such as those set forth in this disclosure. The semiconductor device 300 includes a series of pads 330, 331, 332, 333, 334, 335, 336, 337, and 338. The bit line 316 and the common source 318, along with the series of pads 330, 331, 332, 333, 334, 335, 336, 337, and 338 are disposed in a dielectric first film 340, which may also be referred to as an ILD first film 340. A dielectric second film 342 is disposed above the dielectric first film 340, and the array of the several VRMM memory cells 320, 321, 322, 323, 324, 325, 326, and 327 is disposed in the dielectric second film 342. The dielectric second film 342 may also be referred to as an ILD second film 342. A bit-line trace 344 is disposed above the dielectric second film 342, and a global data bus 346 is coupled to the bit-line trace 344.

Below each of the several VRMM cells 320, 321, 322, 323, 324, 325, 326, and 327 is a corresponding control gate 350, 351, 352, 353, 354, 355, 356, and 357. Each corresponding control gate is configured in parallel to a given VRMM cell. For example, the third control gate 352 is configured in parallel to the third VRMM cell 322. Each electrode has a corresponding electrode contact 360, 361, 362, 363, 364, 365, 366, 367, and 368.

FIG. 3b is a cross-section elevation of the semiconductor device 300 depicted in FIG. 3a according to a method embodiment. Potential and current, illustrated as a dashed line, are depicted as exhibiting presence in the bit line 316, and in the semiconductive substrate 310. According to the method embodiment illustrated, a read or a write operation is being carried out, in the third VRMM cell 322. Accordingly, the select gate 314 has allowed the potential and current from the bit line 316 to be exhibited also in the semiconductive substrate 310. To read or write to the third VRMM cell 322, which is part of an 8-cell memory block according to this embodiment, the control gates 350, 351, 352, 353, 355, 356, and 357 are turned on. The third control gate 352, however, is turned off. This configuration allows depletion in the semiconductive substrate 310, and current passes through the semiconductive substrate 310, but diverts through the third VRMM cell 322 because the third control gate 352 does not allow current to pass through the semiconductive substrate 310 directly therebelow.

In a write operation, the spacer electrode that contacts the pad 332 and the third VRMM cell 322 acts as a de facto bottom electrode and the spacer electrode that contacts the pad 333 and the third VRMM cell 322 acts as a de facto top electrode. Accordingly, "top" electrodes are effectively eliminated compared to conventional VRMM cells. Further, because there is no "top" electrode, a metallization layer is also eliminated compared to conventional VRMM cells.

In a write operation, as illustrated the decimal number "4" may be written in binary into the semiconductor device 300, where one reads from left-to-right, such that the binary number "00000100" is stored therein, where the written-to third VRMM cell 322 would be understood to be a "1" in either a low-resistance (conductive) or a high-resistance (dielectric) state.

FIG. 3c is a cross-section elevation of the semiconductor device 300 depicted in FIG. 3a according to a method embodiment. Potential and current, illustrated as a dashed line, are depicted as exhibiting presence in the bit line 316, and in the semiconductive substrate 310. The decimal number "50" may be written in binary into the semiconductor device 300, where one reads from left-to-right, such that the binary number "01100100" is stored therein, where the written-to sixth, fifth, and third VRMM cells 325, 324, and 332, respectively, would be understood to be a "1" in either a low-resistance (conductive) or a high-resistance (dielectric) state. The writing method includes turning on all control gates except the third 352, fifth 354, and sixth 355.

Figure 5:
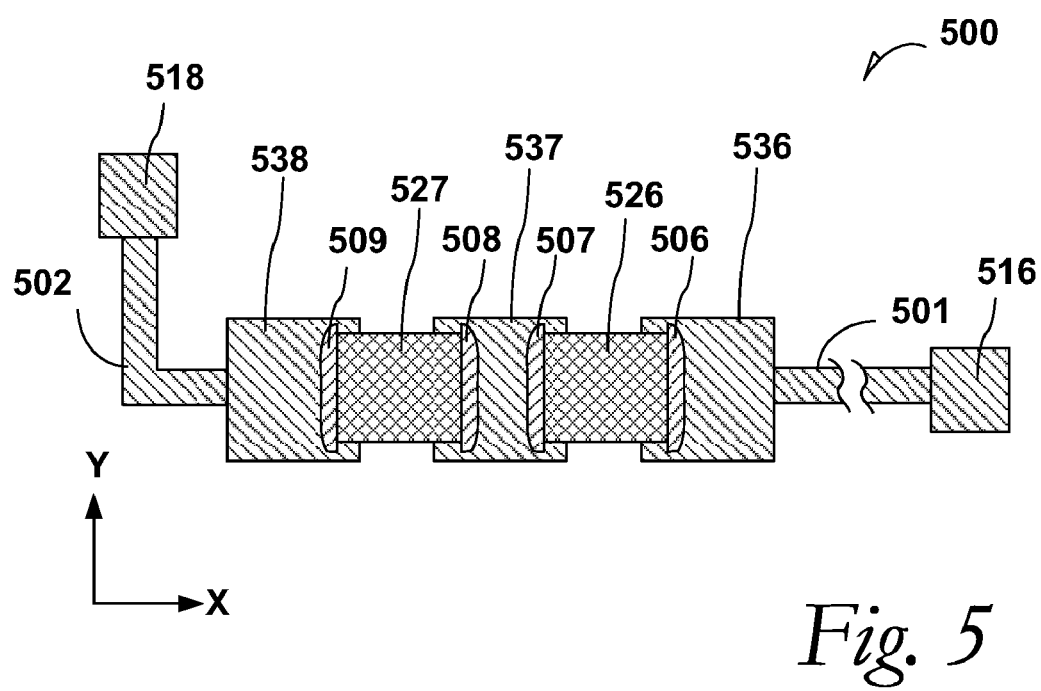
FIG. 5 is a top plan of a portion of the semiconductor device depicted in FIG. 3b according to an embodiment.

FIG. 5 is a top plan of a portion of a semiconductor device 500 such as the semiconductor device 300 depicted in FIG. 3b according to an embodiment. The spacer electrodes 506, 507 are coupled to the pads 536 and 537 respectively. The spacer electrodes 508, and 509 are coupled to the pads 537 and 538 respectively. A bit contact 516 is represented as being coupled to the several pads 536, 537, and 538 through a bit trace 501. A common source contact 518 is represented as also being coupled to the several pads 536, 537, and 538 through a source trace 502.

A seventh VRMM cell 526 is contacted by spacer electrodes 506 and 507, which in turn contact the adjacent sixth pad 536 and seventh pad 537. An eighth VRMM cell 527 is contacted by spacer electrodes 508 and 509, which in turn contact the adjacent seventh pad 537 and eighth pad 538.

The several spacer electrodes assist to create a larger footprint upon the several contacts such that an open circuit is less likely during processing. Further, the several spacer electrodes allow for an electrical embedding of the VRMM cells such that more complete contact over the entire memory cell facilitates reading and writing/erasing during method embodiments of reading/writing, and the electrical contacts between the spacer electrodes and VRMM cells are self-aligned with reduced contact area to decrease the programming current requirement. This is a result of the minimized heat loss through the electrodes.

Figure 6:
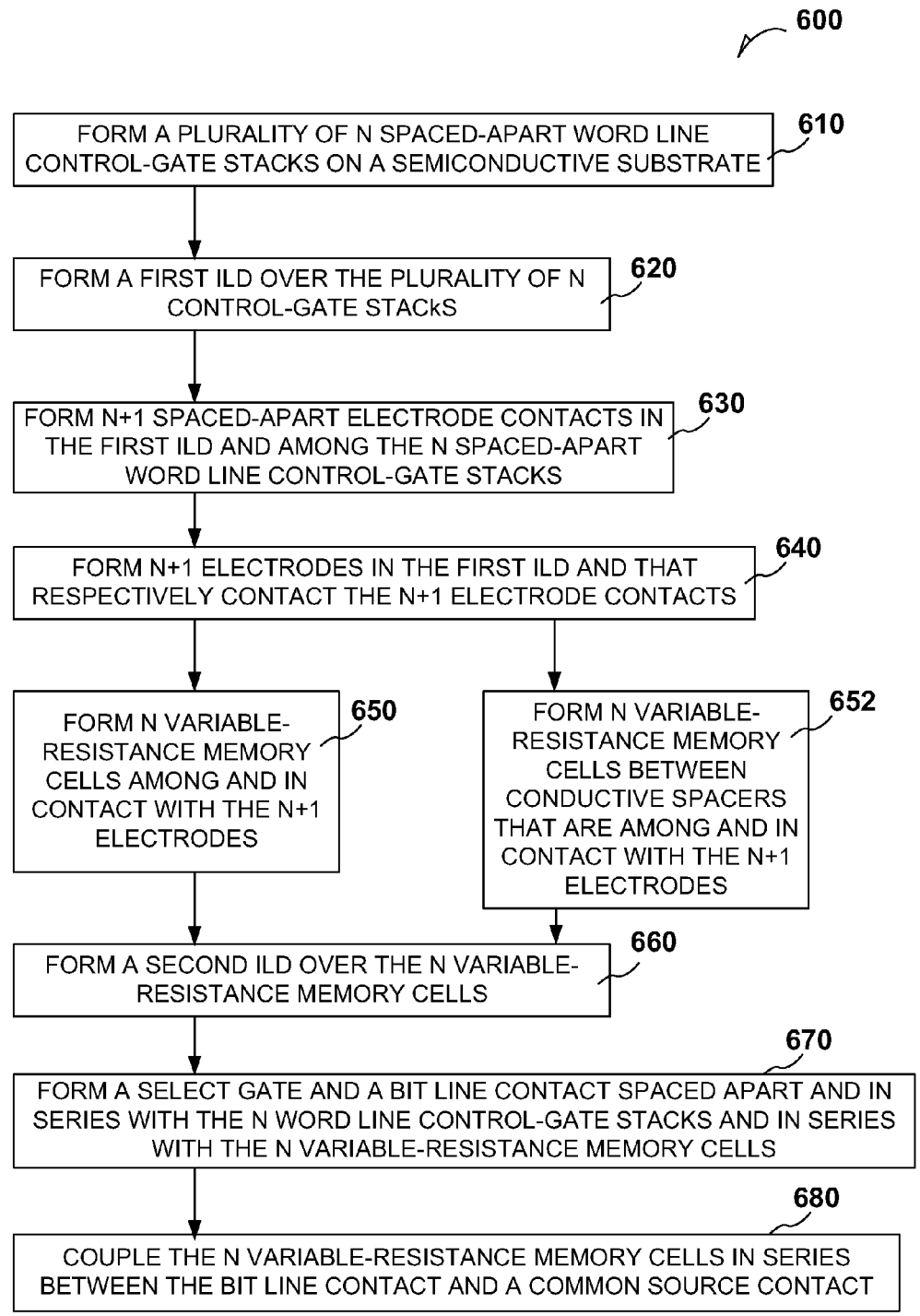
FIG. 6 is a process flow diagram for fabricating a series, variable-resistance material memory device according to an embodiment.

FIG. 6 is a process flow 600 diagram for fabricating a series VRMM device according to an embodiment. The process flow 600 may illustrate fabrication technique embodiments for making the structures depicted in FIGS. 1, 2, and 3.

At 610 the process includes forming a plurality of n spaced-apart word line control gates on a semiconductive substrate. In a non-limiting example, n is equal to eight as illustrated in FIGS. 1, 2, and 3. Although the series of VRMM cells is depicted in these FIGs. are octets, other numbers of VRMM cells may be configured, such as 16, 32, 64, 128, etc.

At 620, the process includes forming a first ILD over the plurality of n word line control-gates.

At 630, the process includes forming n+1 spaced-apart electrode contacts in the first ILD and among the n spaced-apart word line control gates. In a non-limiting embodiment, n+1 equals the nine spaced-apart electrode contacts 160, 161, 162, 163, 164, 165, 166, 167, and 168 are depicted in FIG. 1a.

At 640, the process includes forming n+1 electrodes in the first ILD and that respectively contact the n+1 electrode contacts.

At 650, the process includes forming n VRMM cells among and in contact with the n+1 electrodes. In a non-limiting example, n equals the eight VRMM cells 120, 121, 122, 123, 124, 125, 126, and 127 depicted in FIG. 1a.

At 652, the process may include forming n VRMM cells between conductive spacers that are among and in contact with the n+1 electrodes. In a non-limiting example, n equals the eight VRMM cells variable-resistance memory cells 320, 321, 322, 323, 324, 325, 326, and 327 depicted in FIG. 3*a*.

At 660, the process includes forming a second ILD over the n VRMM cells.

At 670, the process includes forming a select gate and bit line contact spaced apart and in series with the n word line control gates and also in series with the n VRMM cells. In a non-limiting example, the select gate 114 depicted in FIG. 1*a* is formed at the same time as the array of word line control gates 350, 351, 352, 353, 354, 355, 356, 357, and 350.

At 680, the process includes coupling the n VRMM cells between the bit line contact 116 and the common source contact.

Figure 7:
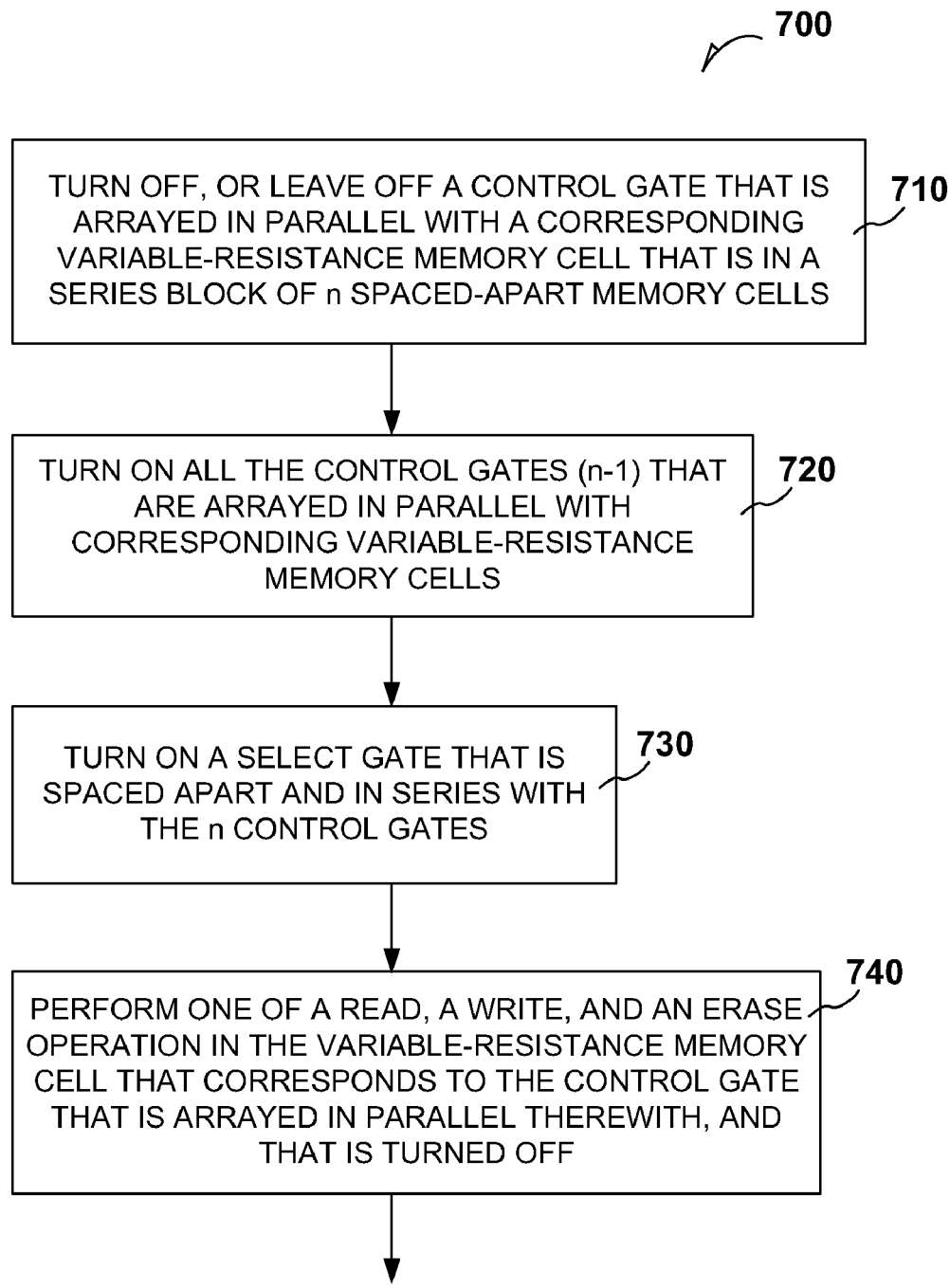
FIG. 7 is a method flow diagram for programming a variable-resistance material memory device according to an embodiment.

FIG. 7 is a method flow 700 diagram for programming a VRMM device according to an embodiment.

At 710, the method includes turning or leaving off a control gate that is arrayed in parallel with a corresponding VRMM cell that is in a series block of n spaced-apart VRMM cells.

At 720, the method includes turning on all the control gates (n−1) that are arrayed in parallel with corresponding VRMM cells.

At 730, the method includes turning on a select gate that is spaced apart and in series with the n control gates.

At 740, the method includes performing one of a read, a write, and an erase operation in the VRMM cell that corresponds to the control gate that is arrayed in parallel therewith and that is turned off. In an example embodiment, multiple bits are programmed simultaneously. For example, the pattern "11010010" is written such that all four "1" bits can be programmed at once and all four "0" bits can be programmed at once. Consequently, instead of eight programming events, a single programming event is carried out to program all eight bits.

Figure 8:
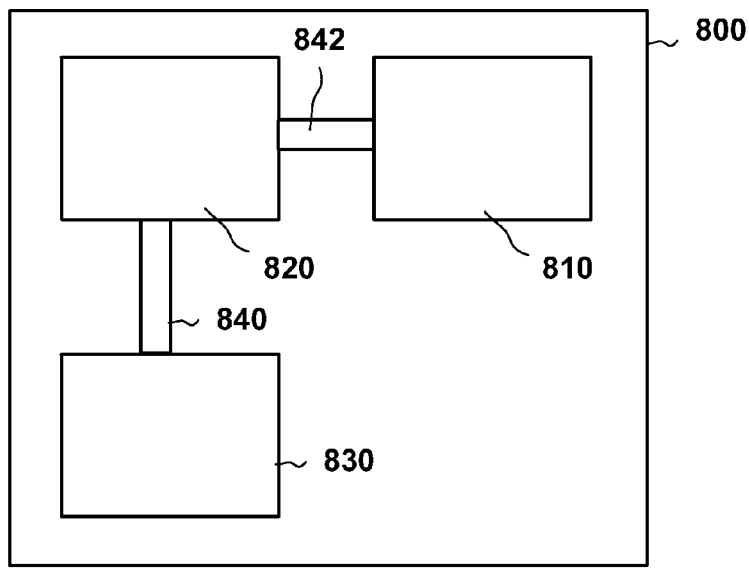
FIG. 8 shows a block diagram of an electronic device according to an embodiment.

FIG. 8 illustrates an electronic device 800 that includes VRMM embodiments as described above. The electronic device 800 includes a first component 820 that benefits from VRMM embodiments. Examples of first component 820 include dynamic random-access memory arrays. In an embodiment, the first component 820 is a processor that includes VRMM memory arrays used for booting up the processor. In these examples, device operation is improved with the presence of VRMM embodiments.

In an embodiment, the device 800 further includes a power source 830. The power source 830 is electrically connected to the first device component 820 using interconnecting circuitry 840. In an embodiment, the interconnecting circuitry 840 includes VRMM embodiments using processing methods described above. In addition to depositing material as described above, techniques such as lithography with masks and/or etching etc. can be used to pattern conducting circuitry.

In an embodiment, the device 800 further includes a second device component 810. The second device component 810 is electrically connected to the first component 820 using interconnecting circuitry 842. Likewise, in one embodiment, the interconnecting circuitry 842 includes VRMM embodiments that are formed using methods described above. Examples of second device components 810 include signal amplifiers, flash memory, logic circuitry, or other microprocessing circuits, etc. Aside from interconnecting circuitry, in an embodiment, the first device component 820 and/or the second device component 810 includes VRMM embodiments using methods described above.

Figure 9:
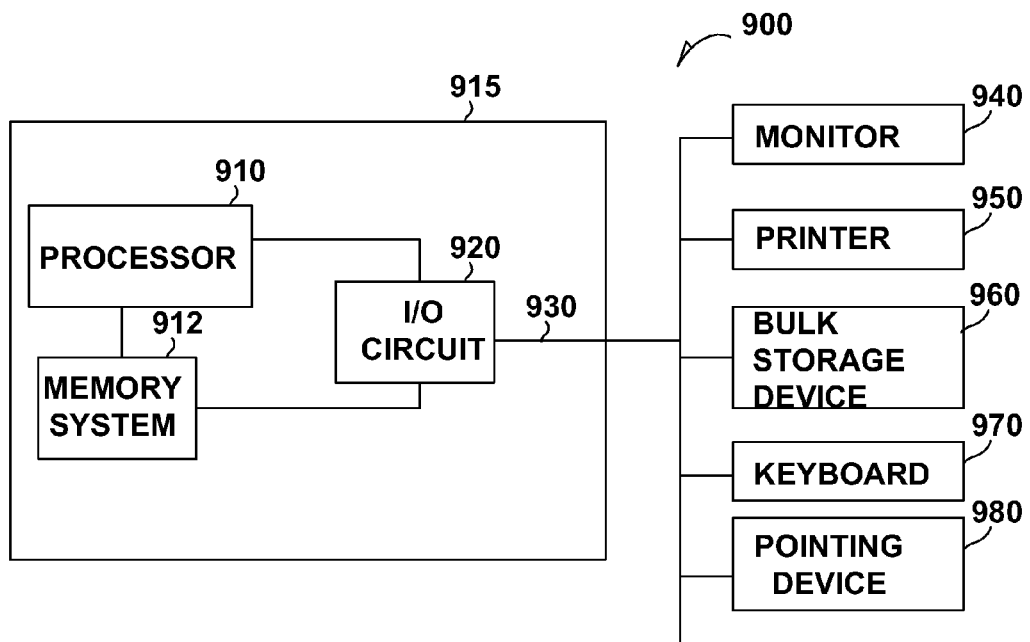
FIG. 9 shows a block diagram of an electronic device according to an embodiment.

FIG. 9 shows one specific example of a computer system including VRMM embodiments formed as described above. The computer system 900 contains a processor 910 and a memory system 912 housed in a computer unit 915. The computer system 900 is but one example of an electronic system containing another electronic system. In an embodiment, the computer system 900 contains an I/O circuit 920 coupled to the processor 910 and the memory system 912. In an embodiment, the computer system 900 contains user interface components coupled to the I/O circuit 920. In an embodiment, a VRMM embodiment is coupled to one of a plurality of I/O pads or pins 930 of the I/O circuit 920. The I/O circuit 920 can then be coupled to at least one of a monitor 940, a printer 950, a bulk storage device 960, a keyboard 970, and a pointing device 980. It will be appreciated that other components are often associated with the computer system 900 such as modems, device driver cards, additional storage devices, etc. It will further be appreciated that the processor 910, the memory system 912, the I/O circuit 920, and partially isolated structures or data storage devices of computer system 900 can be incorporated on a single integrated circuit. Such single package processing units may reduce the communication time between the processor 910 and the memory system 900.

Figure 10:
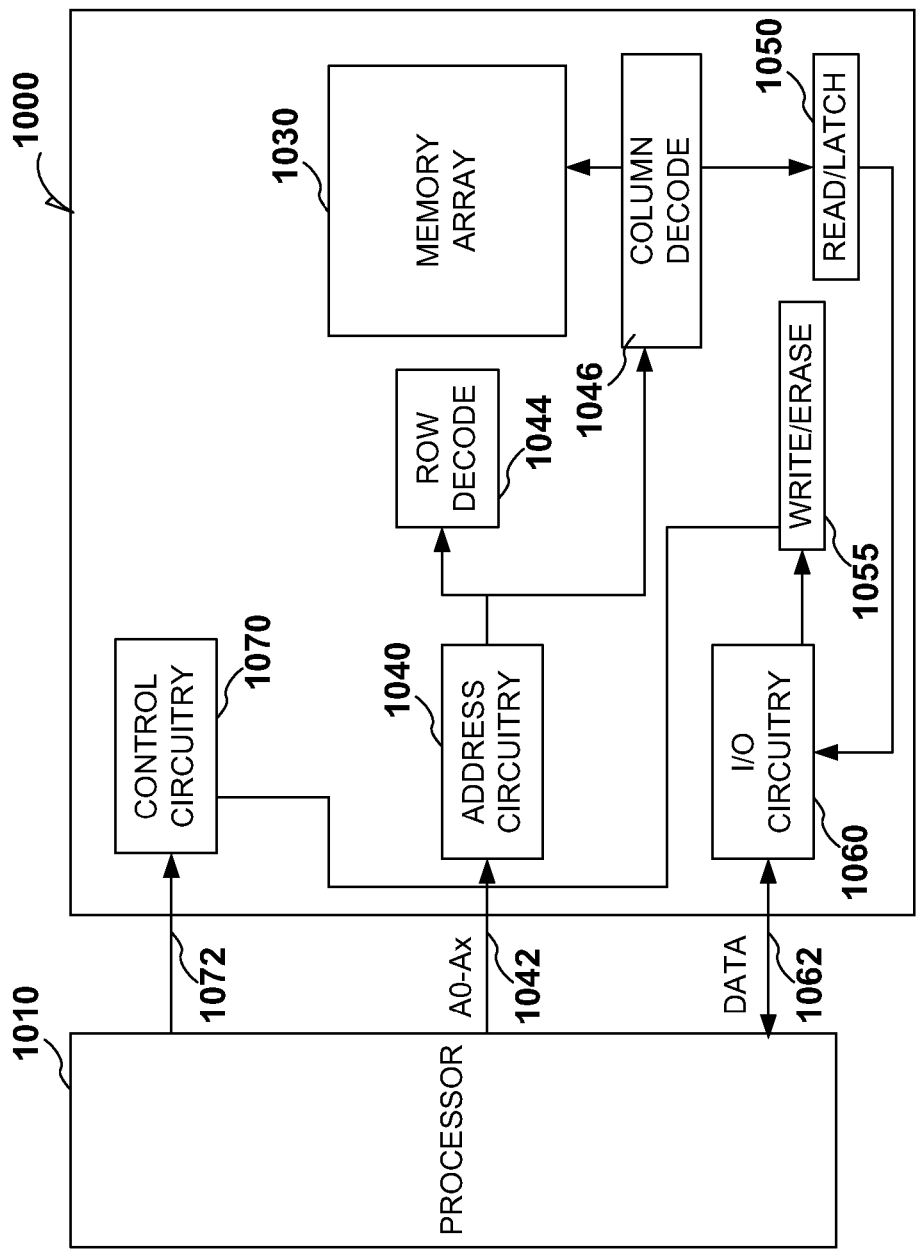
FIG. 10 illustrates a functional block diagram of a memory device that can incorporate the variable-resistance material memory array embodiments.

FIG. 10 illustrates a functional block diagram of a memory device 1000 that can incorporate the variable-resistance material memory array embodiments. The memory device 1000 is coupled to a processor 1010. The processor 1010 may be a microprocessor or some other type of controlling circuitry. The memory device 1000 and the processor 1010 form part of an electronic system 1020. The memory device 1000 has been simplified to focus on features of the memory that are helpful in understanding the several embodiments.

The memory device includes an array of VRMM array cells 1030 that can be comprised of the several VRMM cells as described previously. The VRMM array 1030 is arranged in banks of rows and columns. The control gates of each row of VRMM cells is coupled with a word line while the drain and source connections of the VRMM cells are coupled to bit lines. As is well known in the art, the connections of the cells to the bit lines determines whether the array is a NAND architecture or a NOR architecture. In an embodiment, a NAND VRMM cell architecture is provided.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased VRMM cell counts and increased bank and block counts.

The memory device 1000 reads data in the VRMM array 1030 by sensing voltage or current changes in the memory array columns using sense/buffer circuitry 1050. The sense/buffer circuitry, in one embodiment, is coupled to read and latch a row of data from the VRMM array 1030. Data input and output buffer circuitry 1060 is included for bi-directional data communication over a plurality of data connections 1062 with the controller 1010. Write circuitry 1055 is provided to write data to the VRMM array 1030.

Control circuitry 1070 decodes signals provided on control connections 1072 from the processor 1010. These signals are used to control the operations on the VRMM array 1030, including data read, data write (program), and erase operations. The control circuitry 1070 may be a state machine, a sequencer, or some other type of controller.

The VRMM array 1030 illustrated in FIG. 10 has been simplified to facilitate a basic understanding of the features of the memory device 1000.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be used and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term conductor is understood to include semiconductors and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A method comprising:
    activating at least one of a plurality of control switches, wherein each of the control switches is coupled in parallel with a respective one of a plurality of variable-resistance material memory (VRMM) cells, each VRMM cell coupled to two electrodes through spacer electrodes with the spacer electrodes separated by and coupled to variable-resistance material of the respective VRMM cell such that each spacer electrode contacts a lower film and an upper film with the variable-resistance material of the respective VRMM cell between the lower film and the upper film; and
    activating a select switch to write to or read from those of the plurality of VRMM cells that are coupled in parallel to those of the control switches that were not activated such that current flows through the spacer electrodes of those of the plurality of VRMM cells that were not activated.

2. The method of claim 1, further comprising, before the acts of activating at least one of the plurality of control switches and activating the select switch, writing to all of the plurality of VRMM cells.

3. The method of claim 1, wherein writing to or reading from the VRMM cell includes exhibiting a current and a potential across the VRMM cell between a bit contact and a source contact.

4. The method of claim 3, including providing the current from a global bus to the bit contact.

5. A method comprising:
    turning on a select gate that is arrayed in series with a given control gate, and which control gate is in a series of n control gates;
    turning off the given control gate that is configured in parallel to a given variable-resistance material memory (VRMM) cell, and which given control gate is in a series array of control gates, the given VRMM cell coupled to two electrodes through spacer electrodes with the spacer electrodes separated by and coupled to variable-resistance material of the given VRMM cell such that each spacer electrode contacts a lower film and an upper film with the variable-resistance material of the given VRMM cell between the lower film and the upper film;
    turning on all other control gates in the series array of control gates; and
    writing, reading, or erasing the given VRMM cell.

6. The method of claim 5, wherein the writing, reading, or erasing the given VRMM cell includes exhibiting a current and a potential across the given VRMM cell between a bit contact and a source contact.

7. The method of claim 5, wherein the given VRMM cell is in an array of n series VRMM cells, wherein the given control gate is one in a corresponding array of n series control gates that are configured in parallel to the n series VRMM cells, and wherein the writing, reading, or erasing the given VRMM cell is carried out in the array of n series VRMM cells selected from eight, 16, 32, 64, or 128 VRMM cells.

8. The method of claim 5, wherein the given control gate is a first control gate, wherein the given VRMM cell is a first VRMM cell, further including a second control gate that is configured in parallel to a second VRMM cell and in the series array of control gates; and further including:
    turning off the second control gate; and
    writing or erasing the second VRMM cell.

9. The method of claim 5, wherein the given control gate is a third control gate, wherein the given VRMM cell is a third VRMM cell, further including a sixth control gate that is configured in parallel to a sixth VRMM cell and in the series array of control gates, and a seventh control gate that is configured in parallel to a seventh VRMM cell and in the series array of control gates; and further including:
    turning off the sixth and seventh control gates; and
    writing or erasing the sixth and seventh VRMM cells.

10. A method comprising:
operating multiple sets of variable-resistance material memory (VRMM) cells on a semiconductive substrate, each set having a plurality of VRMM cells connected in a serial arrangement on the semiconductive substrate, each VRMM cell coupled to two electrodes through spacer electrodes with the spacer electrodes separated by and coupled to variable-resistance material of the respective VRMM cell such that each spacer electrode contacts a lower film and an upper film with the variable-resistance material of the respective VRMM cell between the lower film and the upper film; and
switchably removing one of the VRRM cells of one plurality from operating in its respective serial arrangement as the other VRMM cells of the one plurality are operating.

11. The method of claim 10, wherein operating the sets includes operating the plurality of VRMM cells of each set devoid of a metallization layer to the series of VRRM cells.

12. The method of claim 10, wherein operating the sets includes operating the plurality of VRMM cells of each set consisting of n VRMM cells, n being a positive integer greater than one, in the serial arrangement such that the n VRMM cells are capable of storing n-bits.

13. The method of claim 12, wherein the n-bits comprise one of 8, 16, 32, 64, or 128 bits.

14. The method of claim 10, wherein operating the sets includes operating the VRMM cells in a NOR VRMM cell architecture.

15. The method of claim 10, wherein the variable resistance memory includes one of an alloy, a quasi-metal composition, a metal oxide, or a chalcogenide.

16. The method of claim 10, wherein the method includes switchably removing all the VRRM cells in the serial arrangement of a selected set such that current is directed away from flowing in the semiconductive substrate directly below each of the VRRM cells.

17. A method comprising:
operating a plurality of variable-resistance material memory (VRMM) cells connected in a serial arrangement on a semiconductive substrate; and
switchably removing one of the VRRM cells from operating in the serial arrangement as the other VRMM cells are operating, wherein switchably removing one of the VRRM cells includes directing current through variable-resistance material of the one VRMM cell through spacer electrodes with the spacer electrodes separated by and coupled to the variable-resistance material such that each of the spacer electrodes contacts a lower film and an upper film with the VRRM material between the lower film and the upper film.

18. The method of claim 17, wherein the variable-resistance material includes phase-change material.

19. The method of claim 17, wherein the variable-resistance material includes one or more of $Pr_{(1-x)}Ca_xMnO_3$ (PCMO), $La_{(1-x)}Ca_xMnO_3$ (LCMO), or $Ba_{(1-x)}Sr_xTiO_3$.

20. The method of claim 17, wherein the variable-resistance material includes one or more of a binary or ternary doped or undoped oxide.

21. The method of claim 17, wherein the variable-resistance material includes a doped chalcogenide glass.

* * * * *

UNITED STATES PATENT AND TRADEMARK OFFICE
CERTIFICATE OF CORRECTION

PATENT NO. : 8,355,273 B2  
APPLICATION NO. : 12/986717  
DATED : January 15, 2013  
INVENTOR(S) : Jun Liu Page 1 of 1

It is certified that error appears in the above-identified patent and that said Letters Patent is hereby corrected as shown below:

In column 13, line 13, in Claim 10, delete "VRRM" and insert -- VRMM --, therefor.

In column 13, line 19, in Claim 11, delete "VRRM" and insert -- VRMM --, therefor.

In column 14, line 2, in Claim 16, delete "VRRM" and insert -- VRMM --, therefor.

In column 14, line 5, in Claim 16, delete "VRRM" and insert -- VRMM --, therefor.

In column 14, line 10, in Claim 17, delete "VRRM" and insert -- VRMM --, therefor.

In column 14, line 13, in Claim 17, delete "VRRM" and insert -- VRMM --, therefor.

In column 14, line 18, in Claim 17, delete "VRRM" and insert -- VRMM --, therefor.

Signed and Sealed this  
Second Day of April, 2013

Teresa Stanek Rea  
*Acting Director of the United States Patent and Trademark Office*